US008516891B2

(12) United States Patent
Zhang et al.

(10) Patent No.: US 8,516,891 B2
(45) Date of Patent: Aug. 27, 2013

(54) MULTI-STAGE STOPPER SYSTEM FOR MEMS DEVICES

(75) Inventors: Xin Zhang, Acton, MA (US); Michael W. Judy, Ipswich, MA (US)

(73) Assignee: Analog Devices, Inc., Norwood, MA (US)

( * ) Notice: Subject to any disclaimer, the term of this patent is extended or adjusted under 35 U.S.C. 154(b) by 1400 days.

(21) Appl. No.: 12/015,105

(22) Filed: Jan. 16, 2008

(65) Prior Publication Data

US 2012/0228725 A1    Sep. 13, 2012

Related U.S. Application Data

(60) Provisional application No. 60/885,117, filed on Jan. 16, 2007.

(51) Int. Cl.
*G01P 15/02*   (2013.01)
*G01P 15/125*  (2006.01)

(52) U.S. Cl.
USPC ..................................... 73/514.38; 73/514.32

(58) Field of Classification Search
USPC ................. 73/514.32, 514.36, 514.38, 514.29
See application file for complete search history.

(56) References Cited

U.S. PATENT DOCUMENTS

| | | | |
|---|---|---|---|
| 5,542,295 A * | 8/1996 | Howe et al. ................. | 73/514.18 |
| 6,065,341 A * | 5/2000 | Ishio et al. ................. | 73/514.32 |
| 6,272,926 B1 * | 8/2001 | Fehrenbach et al. ........ | 73/514.32 |
| 6,276,207 B1 * | 8/2001 | Sakai et al. ................. | 73/514.16 |
| 6,318,174 B1 * | 11/2001 | Schmiesing et al. ............ | 73/510 |
| 6,360,605 B1 * | 3/2002 | Pinter et al. ................. | 73/514.38 |
| 6,494,096 B2 * | 12/2002 | Sakai et al. ................. | 73/514.32 |
| 6,694,814 B2 * | 2/2004 | Ishio ........................... | 73/514.32 |
| 6,892,576 B2 * | 5/2005 | Samuels et al. ............ | 73/514.32 |
| 6,923,062 B2 * | 8/2005 | Franz et al. ................. | 73/514.38 |
| 7,000,473 B2 * | 2/2006 | Vandemeer et al. ......... | 73/514.32 |
| 7,019,231 B2 * | 3/2006 | Ishikawa et al. ........ | 200/61.45 R |
| 7,111,513 B2 * | 9/2006 | Sugiura ...................... | 73/514.32 |
| 7,243,545 B2 * | 7/2007 | Sakai et al. ................. | 73/514.32 |
| 7,357,026 B2 * | 4/2008 | Ozawa ........................ | 73/514.33 |
| 7,464,591 B2 * | 12/2008 | Fukuda et al. .............. | 73/514.36 |
| 7,554,340 B2 * | 6/2009 | Furukubo et al. ............. | 324/661 |
| 7,730,783 B2 * | 6/2010 | Classen et al. ............. | 73/514.38 |
| 7,905,146 B2 * | 3/2011 | Suzuki ........................ | 73/514.33 |
| 8,011,247 B2 * | 9/2011 | Glenn .............................. | 73/539 |

\* cited by examiner

*Primary Examiner* — Helen Kwok

(74) *Attorney, Agent, or Firm* — Sunstein Kann Murphy & Timbers LLP

(57) ABSTRACT

A MEMS sensing system includes a movable mass having at least one contact surface, a stopper system for stopping the movement of the mass, the stopper system having at least one contact surface that contacts a corresponding contact surface of the mass if a sufficient movement of the mass occurs in a direction, at least one stopper gap formed between the at least one contact surface of the stopper system and the corresponding contact surface of the mass, and a spring system in communication with the at least one stopper gap.

13 Claims, 8 Drawing Sheets

MULTI-STAGE STOPPER SYSTEM FOR MEMS DEVICES

CROSS-REFERENCE TO RELATED APPLICATIONS

This patent application claims priority to U.S. Provisional Patent Application No. 60/885,117 filed Jan. 16, 2007, entitled MULTI-STAGE STOPPER SYSTEM FOR MEMS DEVICES, the disclosure of which is incorporated by reference herein in its entirety.

FIELD OF THE INVENTION

The invention generally relates to a spring system for MEMS devices and, more particularly, the invention relates to a stopper system with a spring system for MEMS sensors.

BACKGROUND OF THE INVENTION

A variety of different applications use sensor systems to detect the movement of an underlying object. For example, inertial sensors, e.g., accelerometers or gyroscopes, are used in safety and navigation systems for automotive, military, aerospace and marine applications. Sensors may be formed using micromachining processes and may include microelectromechanical systems (MEMS). In MEMS devices, certain micromachined structures are designed to move relative to a substrate and other micromachined structures in response to forces applied in a predetermined manner, such as along a predetermined axis of the device. The movement of certain of the structures permits the generation of signals proportional to the magnitude, direction, and/or duration of the force.

For example, one type of MEMS accelerometer employs a movable mass constructed with fingers adjacent and parallel to fingers of one or more fixed, non-moving structures, with all of these structures suspended in a plane above the substrate. The movable structure and the fixed structure form a capacitor, having a capacitance that changes when the movable structure moves relative to the fixed structure in response to the force. Exemplary MEMS accelerometers are discussed in greater detail in U.S. Pat. No. 5,939,633 and exemplary MEMS gyroscopes are discussed in greater detail in U.S. Pat. No. 6,505,511, the disclosures of which are incorporated herein by reference in their entireties.

MEMS devices typically rely on fixed, rigid stoppers to prevent the movable mass from contacting other components or parts during a shock event. For example, if a finger from the movable structure moves into contact with a corresponding fixed finger, the fingers may stick due to electrostatic attraction, causing the device to fail. Moreover, excessive shock to the device may generate large impact forces that may break the MEMS structures or dislocate particles on the mass or fixed structures. These broken or dislocated components undesirably may fall into critical sensing areas and render the sensor inoperative. Furthermore, continuous shock may keep the mass contacting the stopper, thus wearing out the stoppers and causing stiction or electrostatic capture failures.

SUMMARY OF THE INVENTION

In accordance with one aspect of the invention, a MEMS system includes a movable mass having at least one contact surface, a stopper system for stopping the movement of the mass, the stopper system having at least one contact surface that contacts a corresponding contact surface of the mass if a sufficient movement of the mass occurs in a direction. The system further includes at least one stopper gap formed between the at least one contact surface of the stopper system and the corresponding contact surface of the mass and a spring system in communication with the at least one stopper gap.

In accordance with related embodiments, a portion of the spring system may be serpentine shaped. The spring system may be formed in the mass, in the stopper system, or both. The stopper system may include a stopper and the spring system may include at least two spring structures, each spring structure in communication with a different stopper gap around the stopper. The stopper system may include a stopper and the spring system may include at least two spring structures in communication with the same stopper gap along one side of the stopper. The stopper system may include a plurality of stoppers, each stopper and the mass having at least one stopper gap between at least one contact surface of the stopper and the corresponding contact surface of the mass, wherein the spring system is in communication with at least one stopper gap in at least one of the plurality of stoppers. The spring system may include at least two spring structures, each spring structure in communication with at least one stopper gap in each of the plurality of stoppers. The stopper system may include a stopper and the stopper and the mass may be arranged to form at least one protrusion protruding into at least one stopper gap.

In accordance with another aspect of the invention, a MEMS system includes a movable mass having at least one contact surface, a plurality of stoppers for stopping the movement of the mass, each stopper having at least one contact surface that contacts a corresponding contact surface of the mass if a sufficient movement of the mass occurs in a direction. The system further includes stopper gaps between each of the at least one contact surface of the stopper and the corresponding contact surface of the mass and a spring system in communication with at least one of the stopper gaps.

In accordance with related embodiments, a portion of the spring system may be serpentine shaped. The spring structure may be formed in the mass, in the stopper, or both. The spring system may include at least two spring structures, each spring structure in communication with a different stopper gap around the stopper.

In accordance with another aspect of the invention, a method of producing an impact resistant MEMS sensor includes providing a movable mass having at least one contact surface, providing a stopper system for stopping the movement of the mass, the stopper system having at least one contact surface that contacts a corresponding contact surface of the mass if a sufficient movement of the mass occurs in a direction, forming at least one stopper gap between the at least one contact surface of the stopper system and the corresponding contact surface of the mass, and forming a spring system that abuts the at least one stopper gap.

In accordance with related embodiments, the spring system may be formed in a serpentine shape. The spring system may be formed in the mass, in the stopper system, or both. The stopper system may include a stopper and forming a spring system may include forming at least two spring structures, each spring structure abutting a different stopper gap around the stopper. The stopper system may include a stopper, and forming a spring system may include forming at least two spring structures abutting the stopper gap along one side of the stopper. The stopper system may include a plurality of stoppers and forming at least one stopper gap may include forming the at least one stopper gap between at least one contact surface of each stopper and the corresponding contact surface of the mass, and forming a spring system may include forming more than one spring structure, each spring structure abutting at least one stopper gap in at least one of the plurality of stoppers. Each spring structure may abut at least one stopper gap in each of the plurality of stoppers. The method may further include forming at least one protrusion protruding into the at least one stopper gap.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Embodiments of the present invention provide a multi-stage stopper system for MEMS devices that reduces the impact force and improves the MEMS device shock survivability, durability and reduces particle susceptibility, thus significantly improving the quality and reliability of MEMS sensing systems. One embodiment of the multi-stage stopper system engineers how a mass comes into contact with rigid members of the MEMS device. For example, the number of stoppers that are used in the deceleration of the mass may be varied and their placement may be varied, allowing the load that each stopper, or portion of a stopper, experiences to be controlled when the moving mass contacts the stopper. This distribution of load allows the load to be reduced for each individual stopper or portion of the stopper, reducing the potential for breakage of the stopper and/or a portion of the mass.

To this end, the mass and stopper system may be arranged such that the existing space or gap between the mass and the stopper is extended or opened up along at least one side of the stopper to form a spring structure. The spring structure may be formed primarily within the mass and/or primarily within the stopper and is adjacent to or abuts the stopper gap formed between the mass and the stopper. The spring structure allows the mass and/or the stopper to become more compliant or flexible near the spring structure. This allows the mass to more readily contact the stopper system incrementally at two or more stoppers, two or more portions of a stopper, or both. In addition, embodiments allow the gaps to close more fully, increasing the lateral damping of the system and thus, further distributing and dissipating the overload energy the system handles. In addition to reducing the probability of breakage, the points of contact may experience a reduced amount of wear.

Figure 1A:
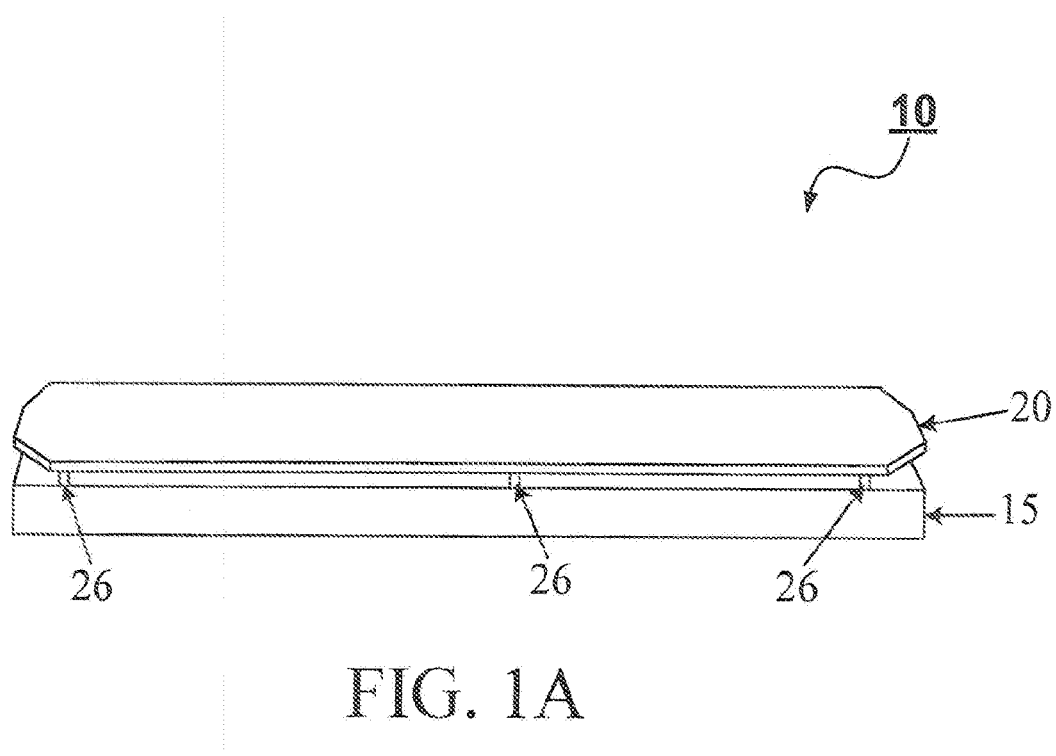
FIG. 1A shows a perspective view of an illustrative two-axis accelerometer with a stopper system according to embodiments of the present invention.
Figure 1B:
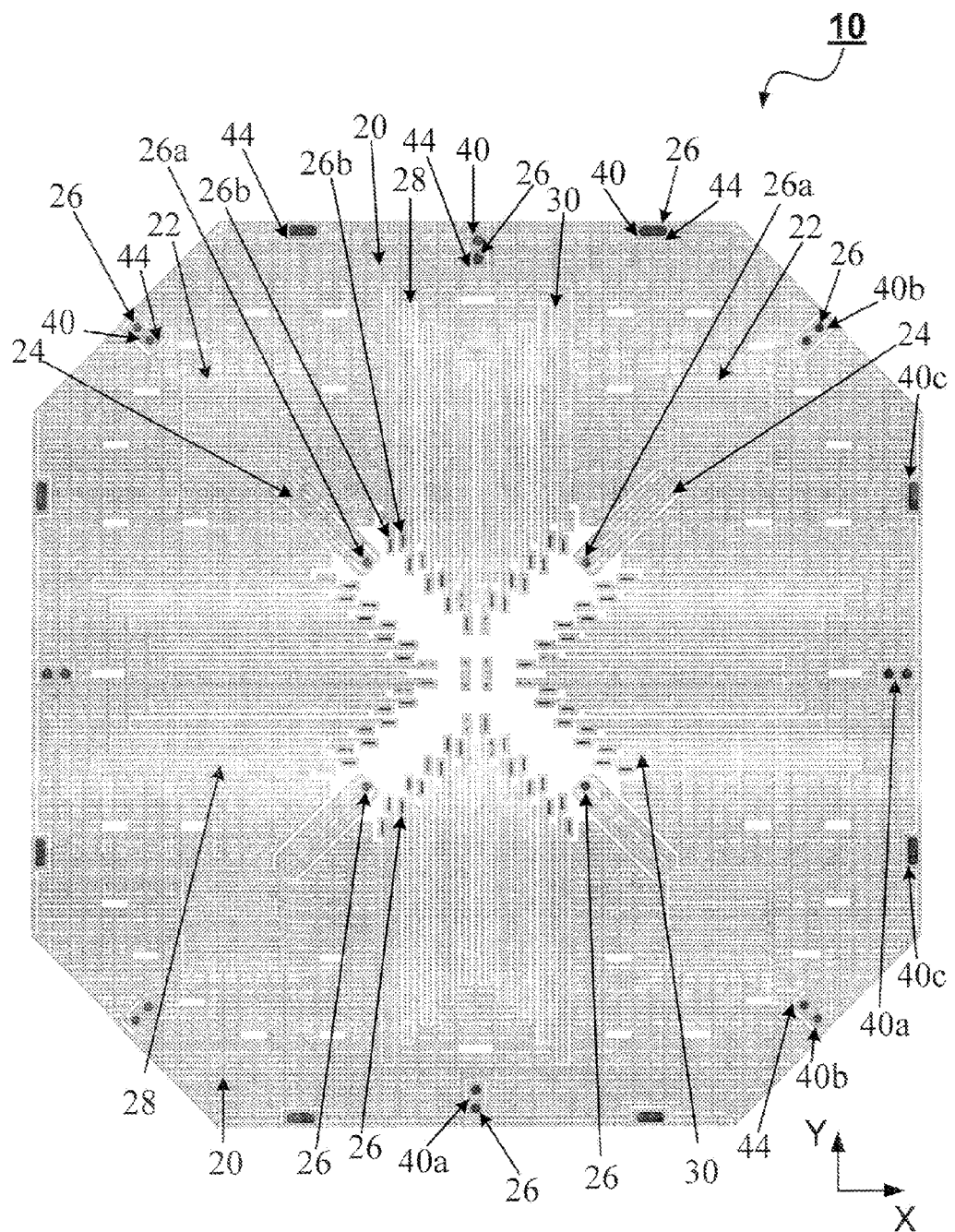
FIG. 1B shows a top view of an illustrative two-axis accelerometer with a stopper system according to embodiments of the present invention.

FIG. 1A shows a perspective view and FIG. 1B shows a top view of an illustrative two-axis accelerometer with a stopper system according to embodiments of the present invention. The figures are not drawn to scale and FIG. 1A does not show details of the mass and stopper system. The accelerometer 10 includes, among other things, a mass 20 suspended above a substrate 15 by mass support structures, including suspension springs 22 and support arms 24, and anchors 26 for fixing the support arms 24 and other various components of the accelerometer 10 to the substrate 15. The support arms 24 are each anchored to the substrate 15 using a single anchor or multiple anchors 26a. The suspension springs 22 couple the mass 20 to the support arms 24 and are typically serpentine-shaped. The suspension springs 22 permit the mass 20 to move relative to the substrate 15 in response to a force. For example, the mass 20 moves along the X-axis relative to the substrate 15 in response to a force having a component along the X-axis and along the Y-axis in response to a force having a component along the Y-axis. The mass 20 may also move along the Z-axis relative to the substrate 15, i.e., closer to or away from the substrate 15. As known by those in the art, it is not necessary that the mass 20 respond equally to forces of the same magnitude applied along the different axes.

The accelerometer 10 also includes fixed sensing fingers 28 that are coupled to the substrate 15 by the anchors 26. In a single-axis accelerometer, the fixed sensing fingers 28 are typically oriented perpendicular to the axis of motion of the mass 20. In a two-axis accelerometer, the fixed sensing fingers 28 are typically oriented along both axes. For example, as shown in FIG. 1B, the fixed sensing fingers 28 may be positioned between the "V" portions of each pair of the support arms 24 along the X- and Y-axes of motion of the mass 20. The fixed sensing fingers 28 may be positioned so that the location of its anchors 26b are close to the support arm anchor(s) 26a toward the center of the accelerometer 10. The fixed sensing fingers 28 may be affixed to the substrate 15 using elongated anchors or double anchors in order to reduce rotation about its anchor(s) 26b.

The mass 20 includes mass fingers 30 that are interdigitated with the fixed sensing fingers 28 to form a differential capacitor. In illustrative embodiments, there are two fixed sensing fingers 28 between each pair of mass fingers 30. The capacitance of the differential capacitor changes in response to movement of the mass 20 and its mass fingers 30 relative to the fixed sensing fingers 28. The resulting change in capacitance may be measured as an acceleration. For example, movement of the mass 20 to the right along the X-axis brings each vertical mass finger 30 closer to the adjacent vertical fixed sensing finger 28 to the right of the mass finger 30 and further from the adjacent fixed sensing finger 28 to the left of it.

The accelerometer 10 also includes a stopper system coupled to the substrate 15 by the anchors 26 for limiting the amount of movement by the mass 20. The stopper system ensures that the mass 20 and its mass fingers 30 are prevented from contacting other components or parts of the accelerometer 10. The stopper system includes one or more stoppers 40 positioned at various locations in the accelerometer 10. As shown in FIG. 1B, the stopper system may include stoppers 40 surrounding the exterior of the accelerometer 10, limiting movement of the mass 20 in all directions along the X-Y plane. For example, the stoppers 40 may include X-Y stoppers 40a placed along the X- and Y-axes of the accelerometer 10, diagonal stoppers 40b placed approximately 45 degrees to the X- or Y-axis, and self-test stoppers 40c placed on either side of each X-Y stopper 40a. In addition to limiting movement of the mass 20, the self-test stoppers 40c also may be used for diagnostic purposes, e.g., to verify that the sensor is electrically active after processing of the device is complete.

The mass 20 and the stopper system are arranged such that stopper gaps 44 between the mass 20 and the stopper or stoppers 40 are varied. A spring system is formed, as discussed and shown in more detail below, within the mass 20 or within the stopper or stoppers 40 that abuts or is adjacent to the stopper gaps 44. As a result, the mass 20 contacts the stopper(s) 40 incrementally, or in stages, at two or more portions of the stopper system when a sufficient movement of the mass 20 occurs in a given direction. As will be apparent to those skilled in the art, any number of configurations of the mass 20, the stopper(s) 40 and the spring system are possible. Embodiments of the stopper system may include two or more individual stoppers 40 such that at least two of the stoppers 40 have different stopper gaps 44 in a given direction. Alternatively, or in addition, embodiments of the stopper system may include one or more individual stoppers 40 such that the stopper gap 44 between a stopper 40 and the mass 20 varies along at least one side of the stopper 40. This enables the mass 20 to contact the stopper 40 incrementally at two or more portions of the stopper 40. Embodiments of the spring system may include one or more spring structures in or around one or more individual stoppers.

For example, in FIG. 1B, the stopper gap 44 between the mass 20 and the X-Y stopper 40a to the right along the X-axis may be engineered to be smaller than the stopper gap 44 between the mass 20 and the two self-test stoppers 40c and/or the two diagonal stoppers 40b on either side of this X-Y stopper 40a. In this scenario, if the mass 20 moves with a sufficient amount of movement to the right in the X-direction, the mass 20 initially contacts the X-Y stopper 40a to the right and then, due to the further assistance of a spring system in or around the X-Y stopper 40a, the mass 20 deforms or slightly bends around the contacted X-Y stopper 40a, contacting the two self-test stoppers 40c and/or the two diagonal stoppers 40b on either side of the contacted X-Y stopper 40a. This causes the mass 20 to contact the stopper system incrementally, thus allowing the load that each portion of the stopper system experiences to be distributed over more than one stopper 40. For example, in this case, the load is distributed across three or more stoppers 40. After the force that moved the mass 20 is no longer present, the stored potential energy in the mass 20 and in the spring system (due to its deformation) further assists in moving the mass 20 away from the stopper 40, returning it to its original, neutral position. Thus, the stopper system configuration having a spring system also reduces the potential for stiction failures in the device.

Figure 2:
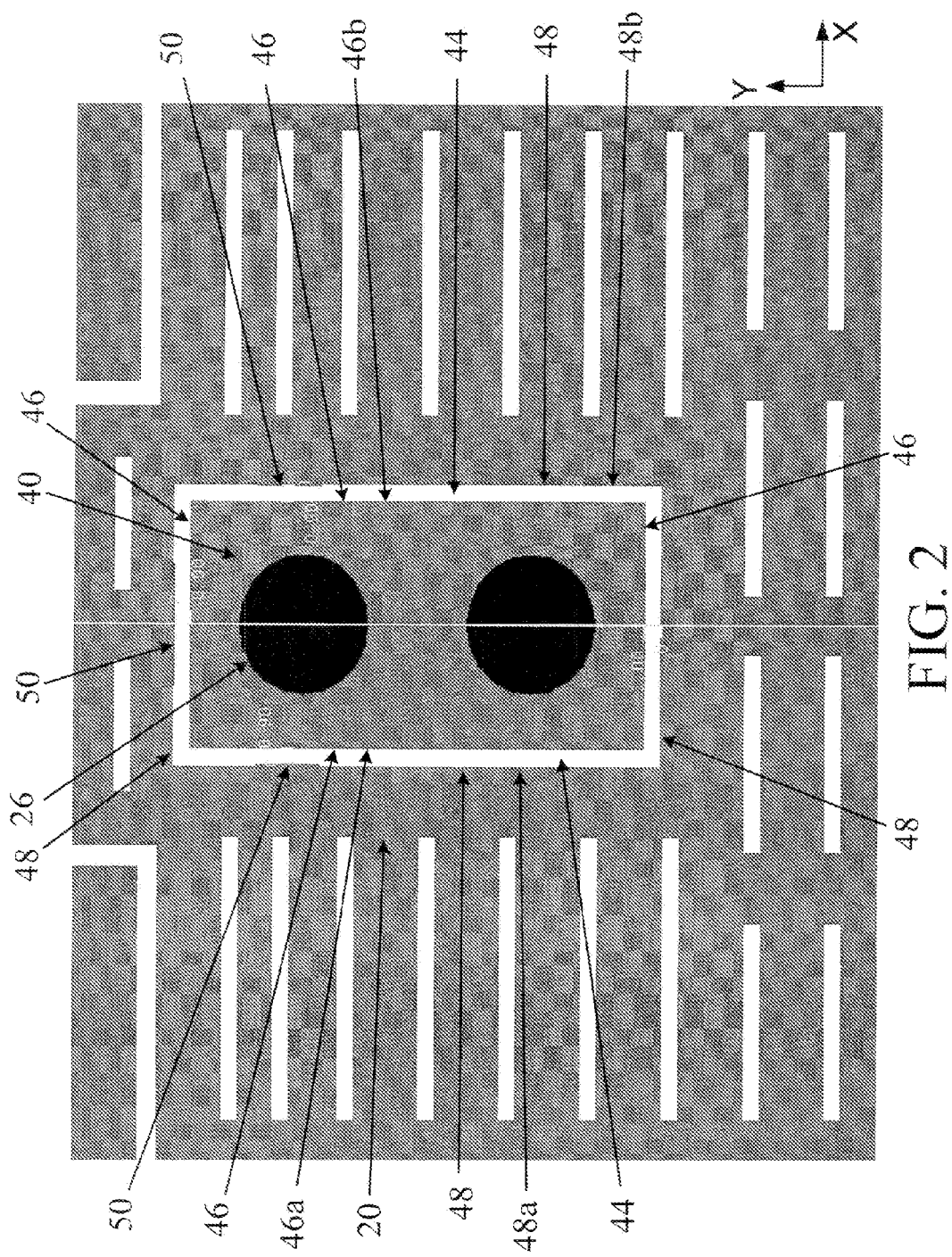
FIG. 2 shows a top view of a mass and stopper arrangement according to illustrative embodiments of the present invention.

FIG. 2 shows a top view of a mass 20 and stopper 40 arrangement, where the stopper gap 44 varies along at least one side of the stopper 40. As shown, the stopper 40 has contact surfaces 46 that contact corresponding contact surfaces 48 on the mass 20 when a sufficient movement of the mass 20 occurs in a given direction. For example, in FIG. 2, the contact surface 46a of the stopper 40 contacts the corresponding contact surface 48a of the mass 20 when the mass 20 moves to the right in the X-direction. Similarly, the contact surface 46b of the stopper 40 contacts the corresponding contact surface 48b of the mass 20 when the mass 20 moves to the left in the X-direction. A similar scenario occurs when the mass 20 moves up or down in the Y-direction.

The stopper gaps 44 are between the contact surfaces 46 of the stopper 40 and the corresponding contact surfaces 48 of the mass 20. Among other widths, the width of the stopper gaps 44 may be about two-thirds the distance that separates the fixed sensing fingers 28 from the mass fingers 30, although the stopper gap widths do not need to be the same around all sides of the stopper 40. For instance, if the distance from the mass fingers 30 to the fixed sensing fingers 28 is approximately 1.5 µm, then the stopper gaps 44 may be around 1 µm.

Along one or more sides of the stopper 40, a protrusion 50 may be formed that protrudes into the stopper gap 44. The width of the stopper gap 44 is smaller at the location of the protrusion 50 than on either side of the protrusion 50. The protrusion 50 enables the mass 20 and the stopper 40 to contact at the location of the protrusion 50 first and then contact on either side of the protrusion 50 at their respective contact surfaces 46, 48. Preferably, the protrusion 50 is approximately 10%±5% of the stopper gap width, although the protrusion 50 may be any width that allows the mass 20 and stopper 40 to contact at the protrusion 50 first and then contact on either side of the protrusion 50. For example, if the stopper gap 44 is approximately 1.1 µm, then the protrusion 50 may protrude into the stopper gap 44 approximately 0.1 µm, making the stopper gap 44 approximately 1.0 µm at the location of the protrusion 50.

Although FIG. 2 shows the arrangement having protrusions 50 to the left, right and top of the stopper 40, any number of protrusions 50 may be formed at any location along one or more sides of the stopper 40. For example, two or more protrusions 50 may be formed along the same side of the stopper 40. In addition, FIG. 2 shows the protrusions 50 formed on the mass 20, but the protrusion(s) 50 may be formed on the stopper 40, or on both the mass 20 and the stopper 40. The anchor or anchors 26 coupling the stopper(s) 40 to the substrate 15 may be located anywhere within the stopper 40, although preferably in the center portion of the stopper 40.

Figure 3:
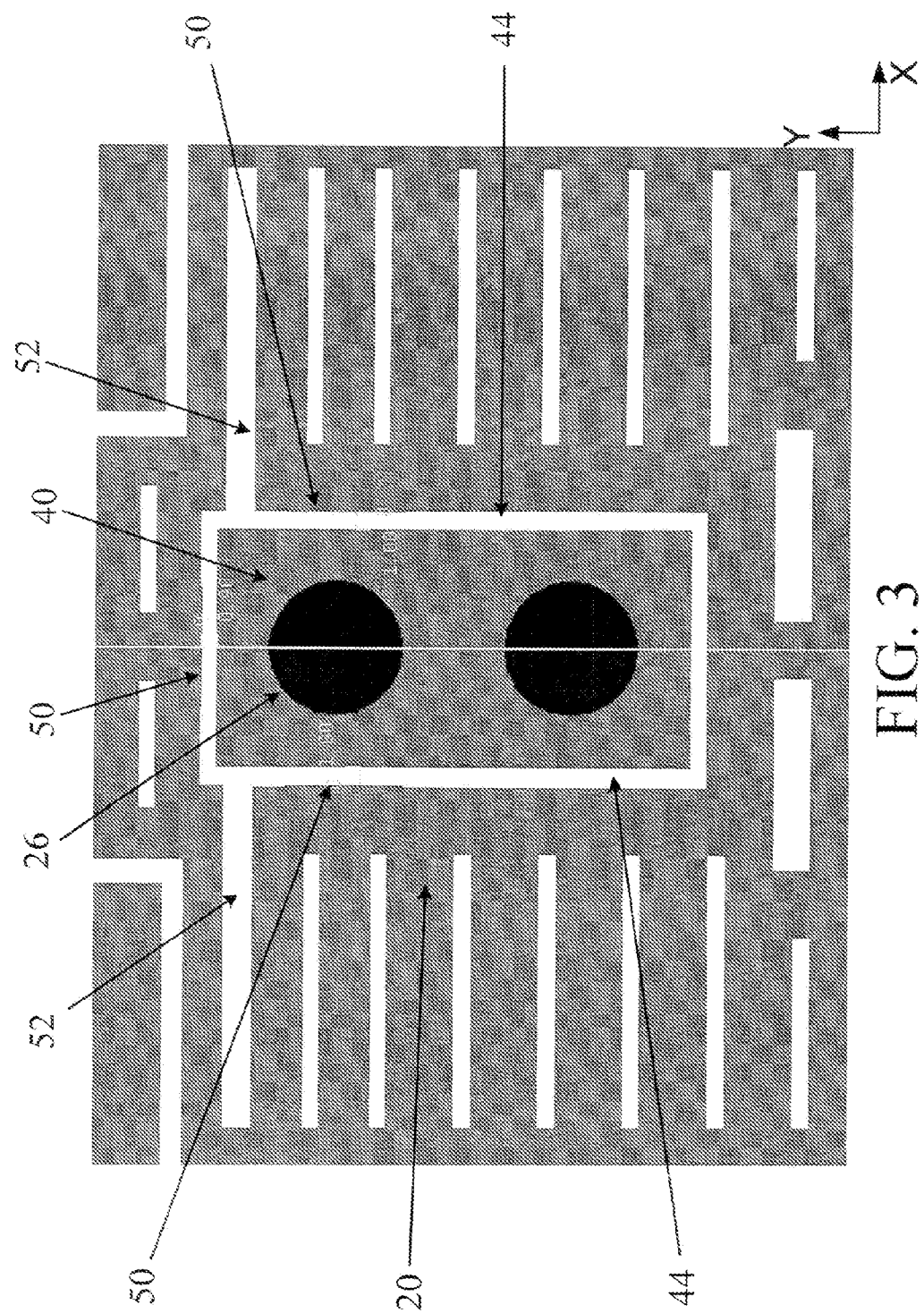
FIG. 3 shows a top view of a mass and stopper arrangement having a spring system in a portion of the mass according to illustrative embodiments of the present invention.

FIG. 3 shows a top view of a mass 20 and stopper 40 arrangement having a spring system according to embodiments of the present invention. As shown, the arrangement is similar to FIG. 2, but includes a spring structure 52 formed in the mass 20 toward the top of the stopper 40 along the horizontal or X-direction that abuts or is adjacent to the stopper gap 44. This spring system further permits the mass 20 to move or bend near the stopper 40 when a force is applied in the Y-direction. Although the spring structure 52 is shown as a rectangular shaped opening formed near one end of the stopper 40, other openings having other shapes or dimensions may be formed in the mass 20, in the stopper, and/or in both at the same or other locations around the stopper 40, abutting or in communication with the stopper gap 44.

Figure 4:
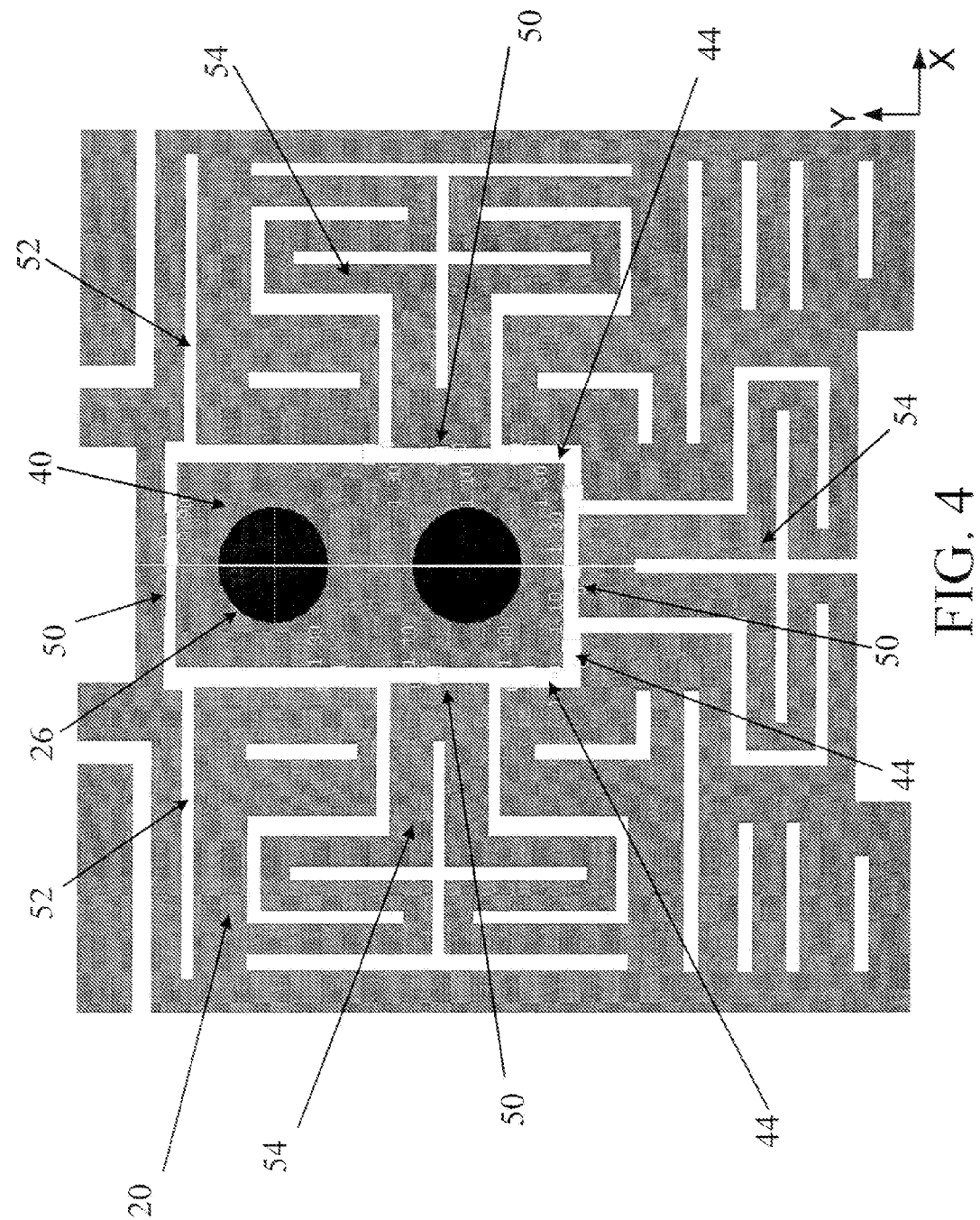
FIG. 4 shows a top view of a mass and stopper arrangement having a spring system in a portion of the mass according to illustrative embodiments of the present invention.

The spring system may be used to further reduce the potential for breakage of the stopper 40 or the mass 20 by distributing and dissipating the overload energy the accelerometer 10 is capable of handling. FIG. 4 shows a top view of a mass 20 and stopper 40 arrangement having a spring system according to embodiments of the present invention. As shown, the spring system may include one or more spring structures 54 formed in a portion of the mass 20 that is adjacent to one or more of the stopper gaps 44. A portion of the spring structures 54 may be serpentine-shaped. The spring system permits the mass 20 to bend or flex more readily near the stopper 40 when the mass 20 contacts the stopper 40, thus reducing the impact force the stopper(s) 40 and mass 20 may experience. For example, in FIG. 4 when the mass 20 moves to the right in the X-direction, the mass 20 initially contacts the left side of the stopper 40 at the location of the protrusion 50 on the left of the stopper 40. The spring structure 54 to the left of the stopper 40 then deforms or slightly bends before and/or when the mass 20 on either side of the left protrusion 50 contacts the stopper 40.

Figure 5:
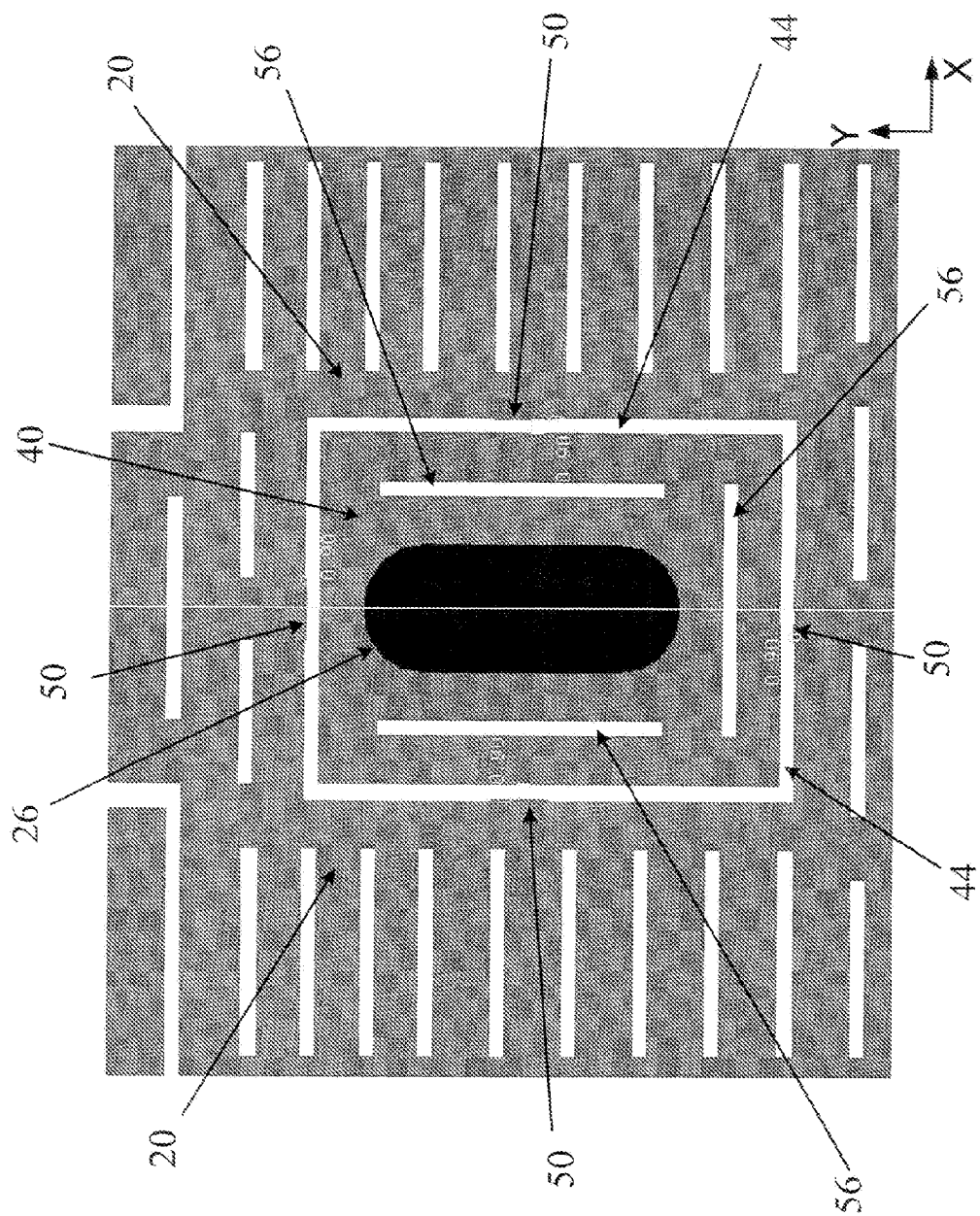
FIG. 5 shows a top view of a mass and stopper arrangement having a spring system in a portion of the stopper according to illustrative embodiments of the present invention.

As shown in FIG. 5, the spring system may include one or more spring structures 56 formed in a portion of the stopper 40. In this case, the spring structures 56 may be relatively straight openings (or may have other opening shapes) formed within the stopper 40 that are parallel to the contact surface of the stopper 40 and that do not abut the stopper gap 44. In this embodiment, the spring system permits the stopper 40 to bend or flex more readily when the mass 20 contacts the stopper 40, making the stopper 40 more compliant. For example, in FIG. 5 when the mass 20 moves to the right in the X-direction, the protrusion 50 to the left of the stopper 40 contacts the left side of the stopper 40. The stopper 40 then bends or flexes toward the anchor 26, reducing or completely collapsing the spring structure opening 56 in the left portion of the stopper 40. In this arrangement, the protrusions 50 are located toward the center of the stopper's contact surface 46 and each spring structure 56 is centered around the protrusion 50, allowing the stopper 40 to flex more readily.

Figure 6:
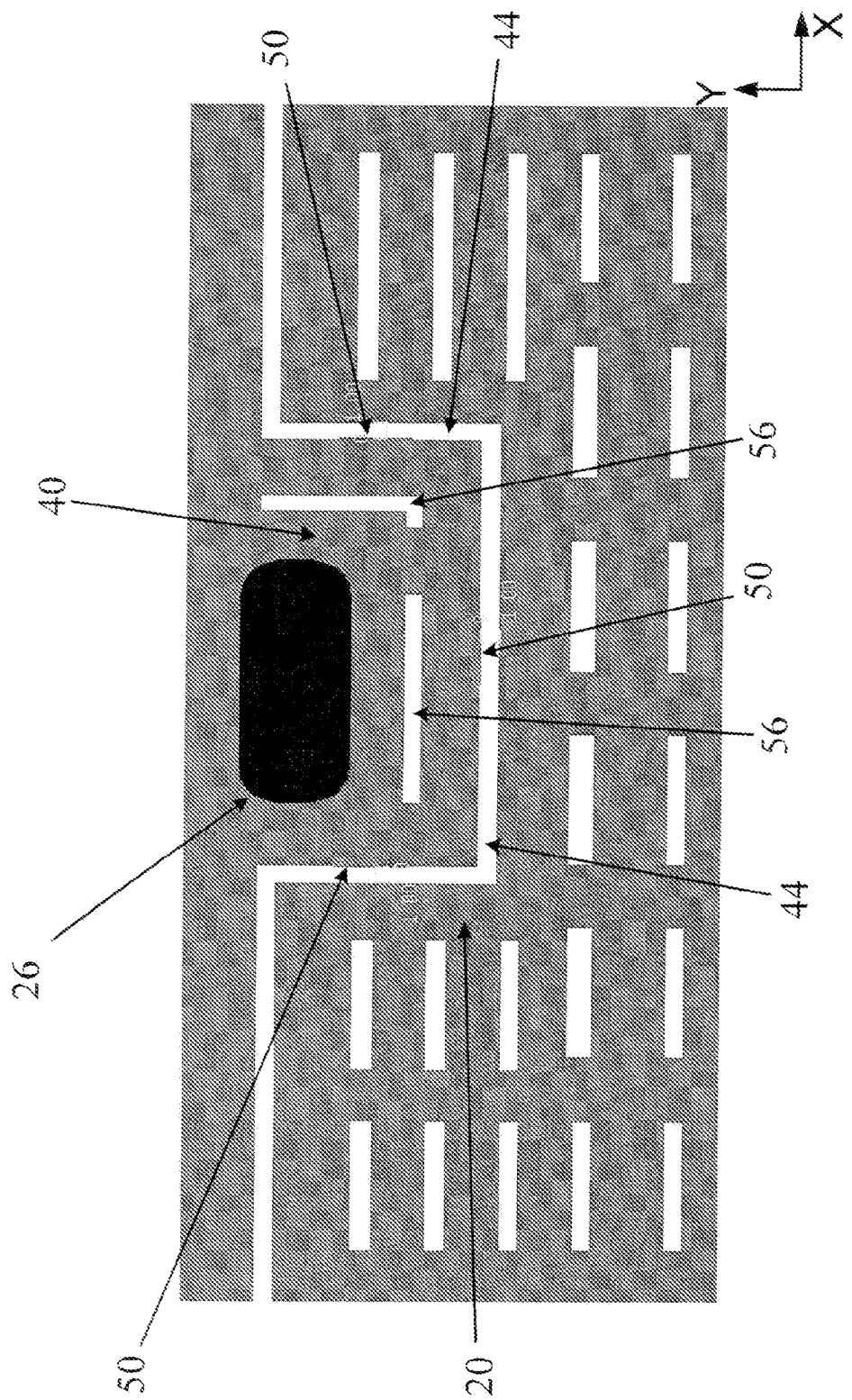
FIG. 6 shows a top view of a mass and stopper arrangement having a spring structure in a portion of the stopper according to illustrative embodiments of the present invention.

FIG. 6 shows another mass 20 and stopper 40 arrangement having a spring system according to embodiments of the present invention. As shown, the protrusions 50 may be formed on the contact surface 46 of the stopper 40 and the spring structures 56 formed within the stopper 40 may be relatively straight or may have other shapes. Although FIGS. 4-6 shows the spring system formed either in a portion of the mass 20 or a portion of the stopper 40, the spring system may also be formed in both. In addition, FIGS. 4-6 discuss the spring system in conjunction with one or more protrusions 50, however the spring system may be used without any protrusions formed.

Figure 7:
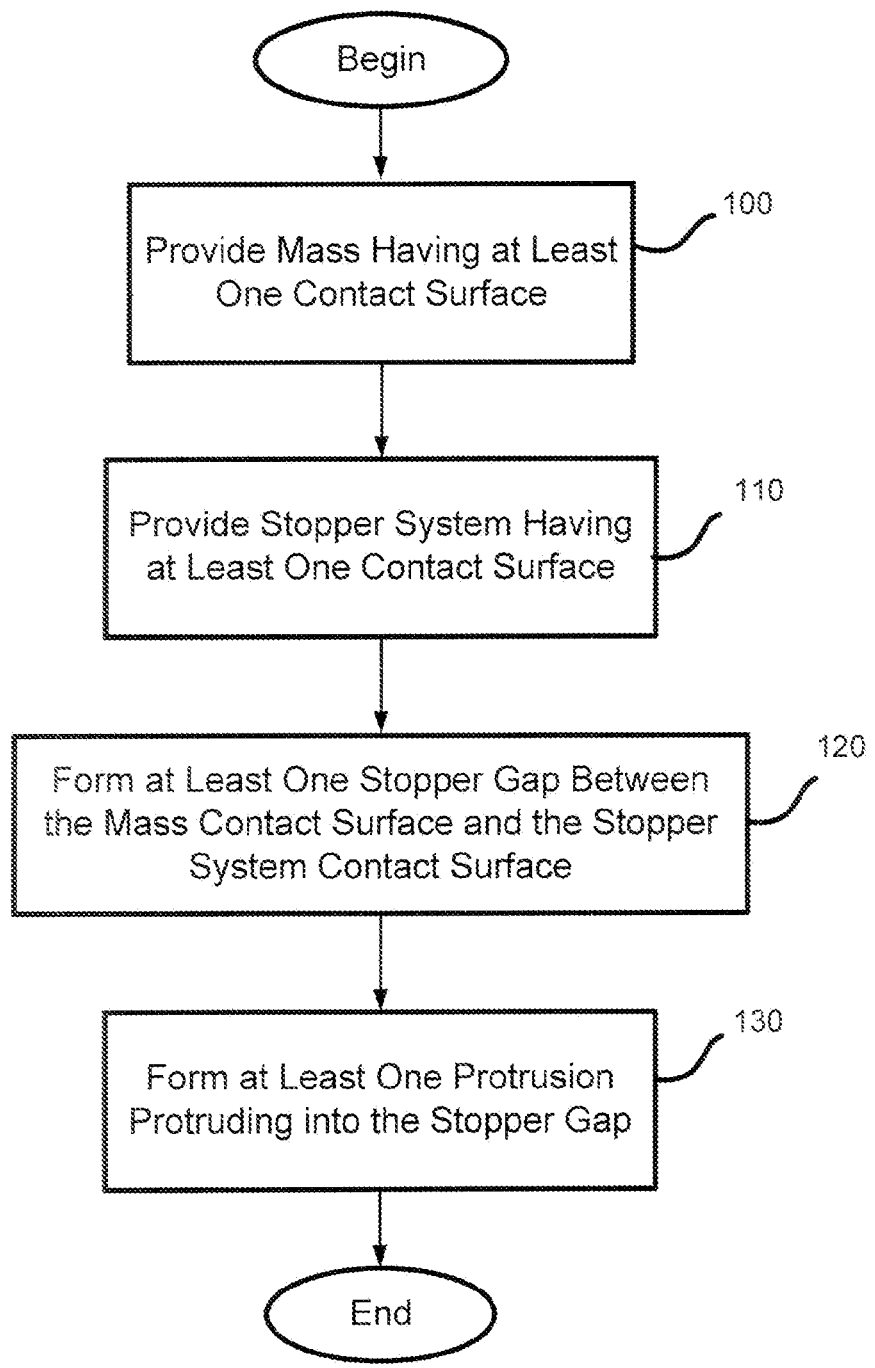
FIG. 7 shows a process of producing an impact resistant MEMS sensor according to illustrative embodiments of the present invention.

FIG. 7 shows a method of producing an impact resistant MEMS sensor according to embodiments of the present invention. Components of the sensor may be formed from polysilicon and produced by standard MEMS processing as is known by those skilled in the art. During processing, multiple layers of material may be deposited on a substrate and then selectively etched away, leaving some structures suspended above the surface of the substrate. As a result of the micromachining process, internal stresses in the various components may cause their relative position to change compared to their position before processing is complete. This is often referred to in the art as shrinkage. The magnitude of the resulting shrinkage that may occur typically is a known function of the distance from the center of the substrate. For example, a structure suspended above a substrate that is located close to the center of the substrate may not experience as much shrinkage as a suspended structure located far away from the center. Thus, the amount of shrinkage is typically factored in when designing the relative positions of the various components so that after processing the components are at their desired positions.

As known by those in the art, the steps described below may be performed concurrently during the micromachining process. The method begins at step 100 by providing a mass 20 having at least one contact surface 48. The mass 20 is suspended above the substrate 15, capable of movement relative to the substrate 15, and coupled to the substrate 15 by one or more anchors, as previously described herein. In step 110, a stopper system is provided having at least one contact surface 46. The stopper system is coupled to the substrate 15 and contacts the corresponding contact surface 48 of the mass 20 if a sufficient movement of the mass 20 occurs in a given direction. In step 120, one or more stopper gaps 44 are formed between one contact surface of the stopper system and the corresponding contact surface of the mass. Optionally, the stopper gaps 44 may be varied across one or more individual stoppers 40 by forming at least one protrusion 50 that protrudes into the stopper gap(s). The stopper gaps 44 may also be varied across a plurality of stoppers 40, such that one or more stoppers 40 have at least one stopper gap width and one or more other stoppers 40 have at least one other stopper gap width. The one width may be less than the other width(s) so that the mass 20 contacts the stoppers 40 incrementally when a sufficient movement of the mass 20 occurs in a given direction. The process then continues to step 130, which forms a spring system in communication with, or abutting with, at least one stopper gap. The spring system may be formed primarily in the mass, primarily in the stopper, and/or both.

Many variations on the various stopper system designs with a spring system described herein are possible. For example, although FIG. 1B shows a stopper system used with a two-axis accelerometer having a configuration of mass fingers, sensing fingers and other components, a wide variety of other configurations of components with differing number of fingers may be employed in an inertial sensor. Also, although an inertial sensor is discussed above, principles of illustrative embodiments may apply to other sensor devices, such as MEMS pressure sensors and MEMS microphones. Accordingly, discussion of inertial sensors is exemplary and not intended to limit the scope of various embodiments of the invention. In addition, the stoppers are described and shown as having a rectangular shape, however any shape may be used as long as the spring system abuts or is in communication with the stopper gaps, which are typically varied, such that the mass contacts the stopper system in stages. Also, protrusions 50 are shown and described along one or more sides of the stopper(s) 40, but a recessed area may be formed in the stopper 40 and/or the mass 20 instead of, or in addition to, the protrusion 50, allowing the stopper gaps 44 to be varied. When varying the stopper gaps 44 in this manner, the stopper gap 44 is larger at the location of the recessed area. Consequently, the mass 20 may contact the stopper 40 on either side of the recessed area first, and then contact the stopper 40 at the location of the recessed area when the mass 20 moves in a given direction.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS system comprising:
    a movable mass having at least one contact surface;
    a stopper for stopping a movement of the mass, the stopper having a first contact surface that contacts a corresponding first contact surface of the mass if a sufficient movement of the mass occurs in a first direction and a second contact surface that contacts a corresponding second contact surface of the mass if a sufficient movement of the mass occurs in a second direction wherein the second direction is opposite to the first direction;
    a first stopper gap formed between the first contact surface of the stopper and the corresponding first contact surface of the mass and a second stopper gap formed between the second contact surface of the stopper and the corresponding second contact surface of the mass; and a spring system in communication with and adjacent to at least one of the first and second stopper gaps wherein the spring system is formed as part of the moveable mass and wherein the spring system comprises at least two spring structures, each spring structure abutting a different stopper gap around the stopper.

2. The MEMS system of claim 1, wherein the stopper includes a third contact surface that contacts a corresponding third contact surface of the mass if a sufficient movement of the mass occurs in a third direction, where the third direction forms a ninety degree angle to the first direction.

3. The MEMS system of claim 1, wherein a portion of the spring system is serpentine shaped.

4. The MEMS system of claim 1, wherein the spring system comprises at least two spring structures in communication with the same stopper gap along one side of the stopper.

5. The MEMS system of claim 1, wherein the stopper and the mass are arranged to form at least one protrusion protruding into at least one stopper gap.

6. A MEMS system comprising:
a movable mass having at least one contact surface;
a plurality of stoppers for stopping a movement of the mass, each stopper having a first contact surface that contacts a corresponding first contact surface of the mass if a sufficient movement of the mass occurs in a first direction and a second contact surface that contacts a corresponding second contact surface of the mass if a sufficient movement of the mass occurs in a second direction wherein the second direction is opposite to the first direction;
stopper gaps between each of the contact surfaces of the stoppers and the corresponding contact surfaces of the mass; and
a spring system in communication with and adjacent to at least one of the stopper gaps wherein the spring system is formed as part of the moveable mass and wherein the spring system comprises at least two spring structures, each spring structure abutting a different stopper gap around a given stopper.

7. The MEMS system of claim 6, wherein each stopper includes a third contact surface that contacts a corresponding third contact surface of the mass if a sufficient movement of the mass occurs in a third direction, where the third direction forms a ninety degree angle to the first direction.

8. The MEMS system of claim 6, wherein a portion of the spring system is serpentine shaped.

9. A method of producing an impact resistant MEMS sensor, the method comprising:
providing a movable mass having at least one contact surface;
providing a stopper for stopping a movement of the mass, the stopper having a first contact surface that contacts a corresponding first contact surface of the mass if a sufficient movement of the mass occurs in a first direction and a second contact surface that contacts a corresponding second contact surface of the mass if a sufficient movement of the mass occurs in a second direction wherein the second direction is opposite to the first direction;
forming a first stopper gap between the first contact surface of the stopper and the corresponding first contact surface of the mass and a second stopper gap formed between the second contact surface of the stopper and the corresponding second contact surface of the mass; and
forming a spring system as part of the moveable mass that abuts the at least one stopper gap, wherein forming a spring system comprises forming at least two spring structures, each spring structure abutting a different stopper gap around the stopper.

10. The method of claim 9, wherein the stopper includes a third contact surface that contacts a corresponding third contact surface of the mass if a sufficient movement of the mass occurs in a third direction, where the third direction forms a ninety degree angle to the first direction.

11. The method of claim 9, wherein a portion of the spring system is serpentine shaped.

12. The method of claim 9, wherein forming a spring system comprises forming at least two spring structures abutting the stopper gap along one side of the stopper.

13. The method of claim 9, further comprising forming at least one protrusion protruding into the at least one stopper gap.

* * * * *